United States Patent [19]
Ackerman et al.

[11] Patent Number: 5,146,460
[45] Date of Patent: Sep. 8, 1992

[54] LOGIC SIMULATION USING A HARDWARE ACCELERATOR TOGETHER WITH AN AUTOMATED ERROR EVENT ISOLATION AND TRACE FACILITY

[75] Inventors: Dennis F. Ackerman, Beacon; David R. Bender; Salina S. Chu, both of Poughkeepsie; George R. Deibert, Staatsburg; Gary G. Hallock, Pleasant Valley; David E. Lackey, Poughkeepsie; Robert G. Sheldon, Pleasant Valley; Thomas A. Stranko, Poughkeepsie, all of N.Y.

[73] Assignee: International Business Machines, Armonk, N.Y.

[21] Appl. No.: 481,145

[22] Filed: Feb. 16, 1990

[51] Int. Cl.$^5$ .............................................. G06G 7/48
[52] U.S. Cl. ...................................... 371/23; 364/488; 364/578
[58] Field of Search .................. 371/23; 364/578, 488, 364/489, 490

[56] References Cited

U.S. PATENT DOCUMENTS

| | | | |
|---|---|---|---|
| 4,242,751 | 12/1980 | Henckels et al. | 371/23 |
| 4,736,338 | 4/1988 | Saxe et al. | 364/900 |
| 4,891,773 | 1/1990 | Ooe et al. | 371/23 |
| 4,912,707 | 3/1990 | Kogge et al. | 371/12 |
| 4,995,037 | 2/1991 | Imada et al. | 371/23 |

FOREIGN PATENT DOCUMENTS

| | | | |
|---|---|---|---|
| 0148971 | 8/1984 | Japan | 364/578 |
| 0228576 | 9/1990 | Japan | 371/23 |

OTHER PUBLICATIONS

IBM Tech. Disc. Bull., vol. 14, No. 8, pp. 2431-2432, Jan. 1972.
Breur, Functional Partitioning and Simulation of Digital Circuits IEEE Transaction on Computers, vol. C-19, No. 11, Nov. 1970.

Primary Examiner—Joseph Ruggiero
Assistant Examiner—Henry C. Lebowitz
Attorney, Agent, or Firm—Lawrence D. Cutter

[57] ABSTRACT

Software simulators of logic design circuits run slowly but are capable of providing very finely detailed error trace analyses. On the other hand, hardware accelerators operating to perform similar functions are very fast in their execution but are not capable of practically isolating error states or other critical conditions. Accordingly, the present invention provides an interactive system combining software simulators and hardware accelerators so that when desired test results do not favorably compare with simulated results, a mechanism is provided for storing the current hardware accelerator state and restoring the accelerator to a previous checkpoint state which has been saved as a result of a prior periodic interruption. The hardware accelerator is then operated for a time sufficient to bring it up to a state that occurs just before the detected miscomparison. At this point, state information from the hardware accelerator is supplied to a software simulator for detailed error analysis and fault tracing. The hardware accelerator may then be restarted where it left off or with a different task. In this way, optimal utilization is made of expensive hardware accelerator resources while nonetheless providing error event isolation and the ability to generate detailed traces of the simulated behavior.

15 Claims, 8 Drawing Sheets

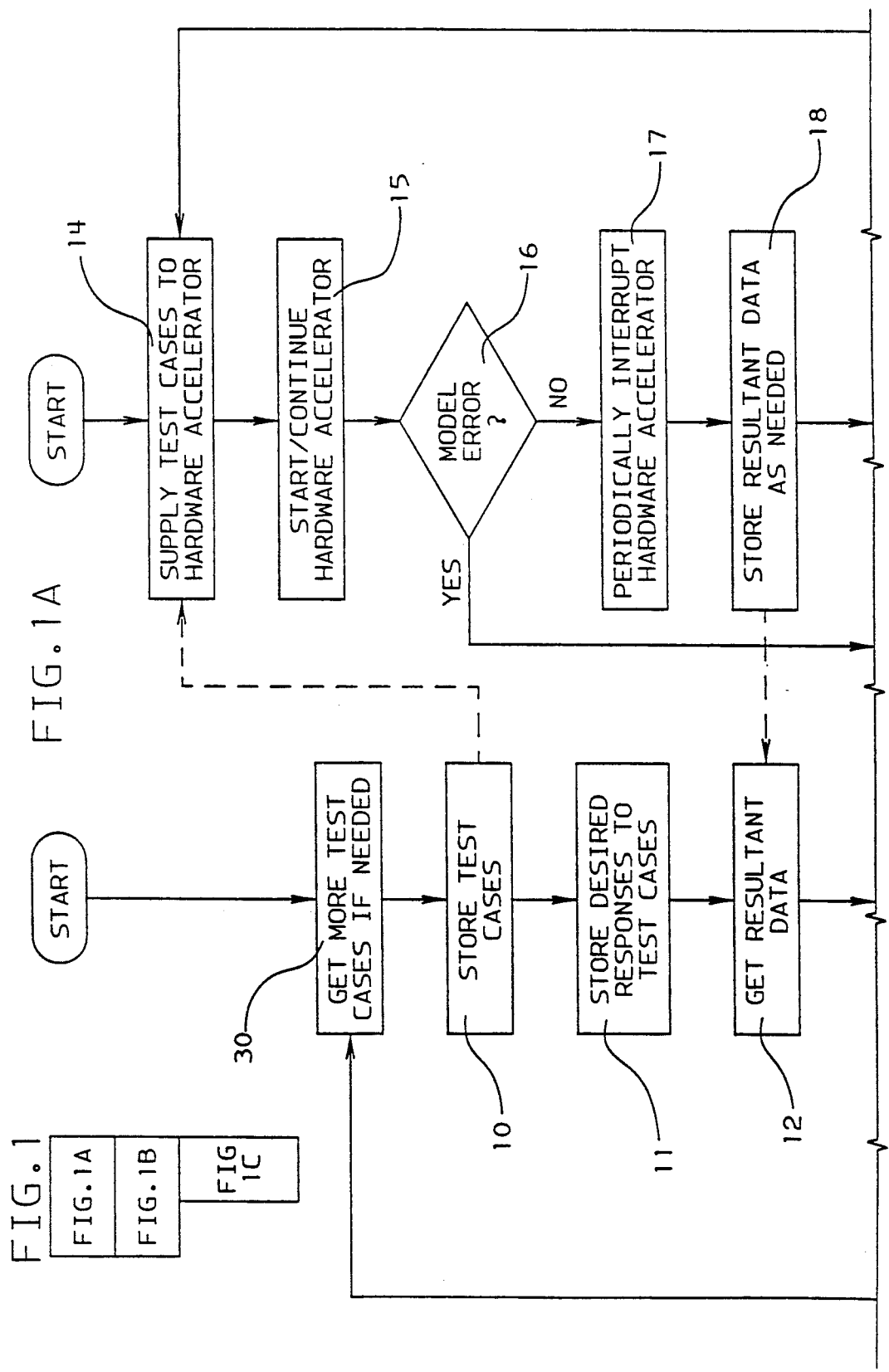

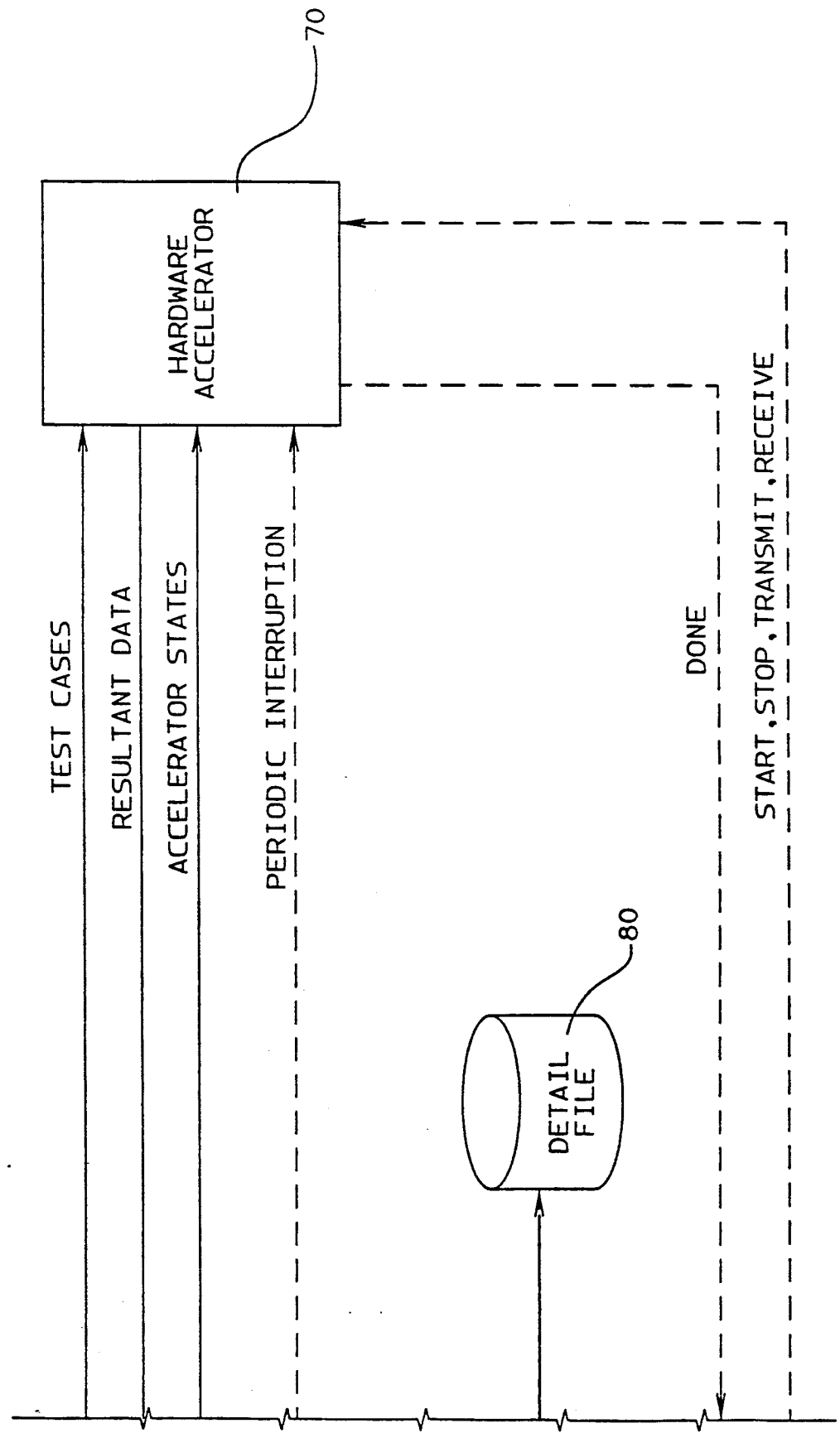

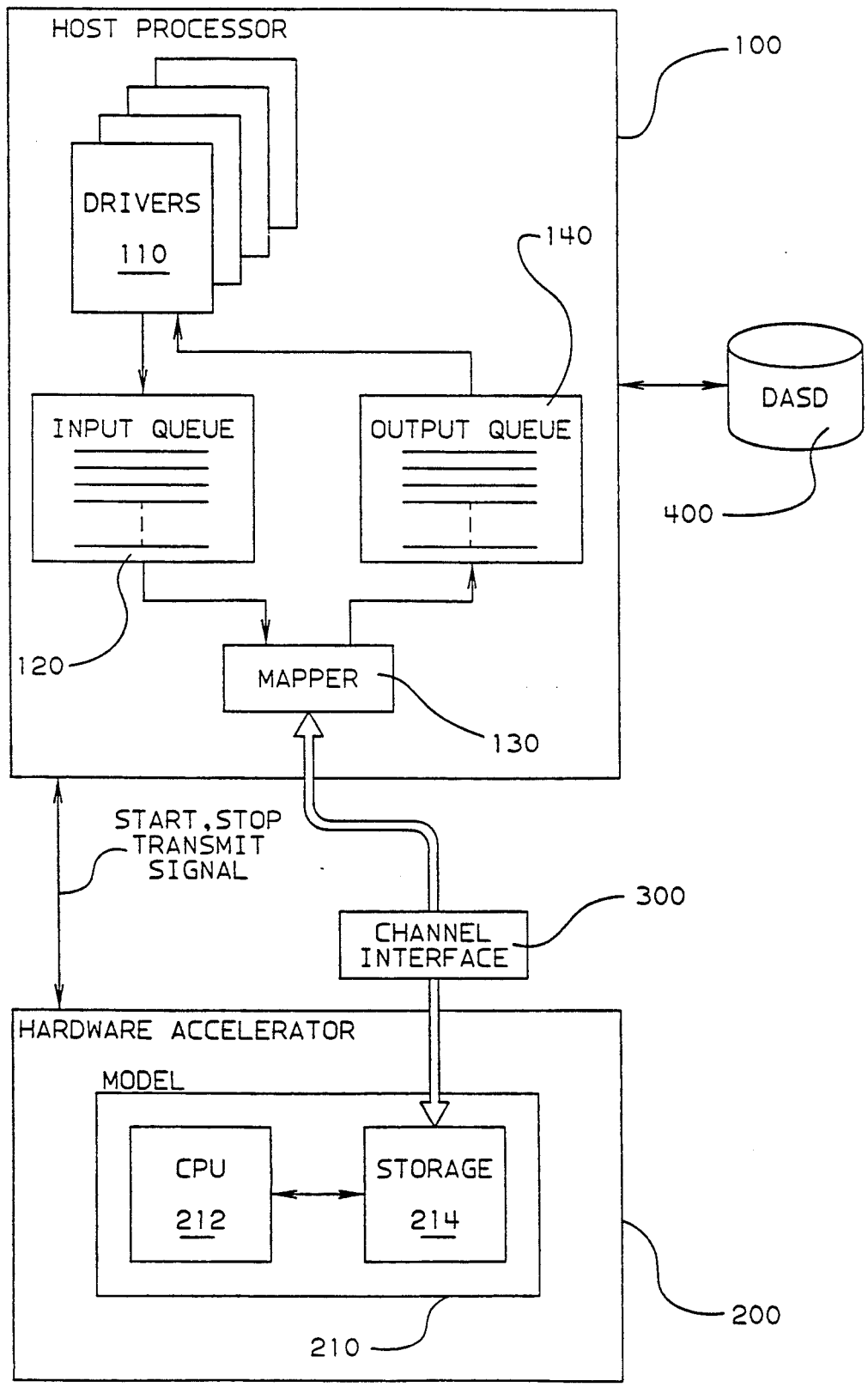

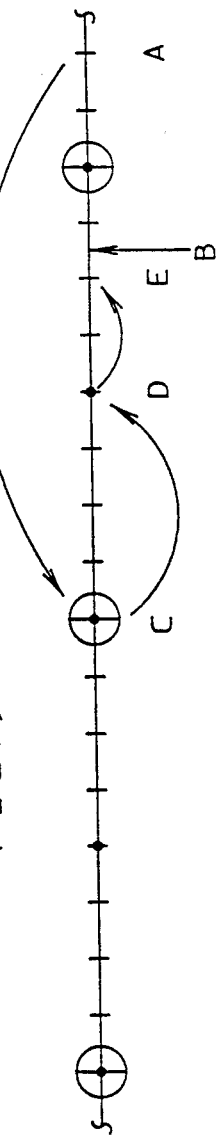
FIG. 4
+ TEST CASE (START OF EXECUTION)
✦ TEST CASE (NEEDWORK TRANSFER PRIOR TO START)
⊕ TEST CASE (NEEDWORK TRANSFER, MODEL CHECKPOINT)
FIG. 5
A = PRESENTLY EXECUTING TEST CASE
B = TEST CASE MISCOMPARE FROM HOST
C = BACKUP CHECKPOINT FOR PLAYBACK
D = NEEDWORK BOUNDARY WITH FLAGGED TEST CASES
E = CHECKPOINT STATE OF MODEL FOR TRANSMISSION TO SOFTWARE SIMULATOR

LOGIC SIMULATION USING A HARDWARE ACCELERATOR TOGETHER WITH AN AUTOMATED ERROR EVENT ISOLATION AND TRACE FACILITY

BACKGROUND OF THE INVENTION

This invention is generally directed to logic circuit simulation systems and methodologies employing hardware accelerators to speed up the simulation process. More particularly, the present invention is related to an interactive method for running a hardware accelerator in conjunction with a software simulator in order to provide automatic error event isolation and trace when error conditions or other critical system states are reached. Even more particularly, the present invention is generally directed to a mechanism in which the time of error is isolated on a hardware accelerator after which the simulation is transported to a software simulator to create the necessary detailed trace information required for problem analysis.

In the design of large scale and very large scale integrated circuits (LSI and VLSI) the complexity of the circuits has required that the circuits be simulated before actually committing to the manufacture of a production run of chip or circuit devices. Furthermore, as the complexity of a circuit chip increases along with the density of circuit devices on the chip, the necessity for simulating the operation of these devices under a large number of possible operating conditions is becoming more and more important. In general, in order to simulate the performance and operation of logic circuit devices, it has been necessary to employ one of two simulation techniques.

One of these techniques is the employment of a software simulation model which accepts a description of the hardware logic and also accepts a set of input signal descriptions to produce desired output states and signals.

The other alternative has been hardware modelling. However, hardware modelling becomes very impractical for large circuit designs, such as those employing over a million logic gates. The physical size of a vendor technology logic model for other than small parts of a large system is prohibitive. Hardware modelling employing early versions of hardware devices is not a practical solution to this problem. In particular, the cost of the initial technology parts is extremely high and many of these parts would often have to be released a second and a third time. This adds significant costs to hardware modelling methods. Additionally, the debug process produces problems of its own. Even with designed-in aids, VLSI designs are difficult to debug.

Software simulation also has significant drawbacks, even though software simulators have made significant advances in the last several years. Software simulator performance is very much dependent upon the size of the models. When one is trying to simulate circuit devices having hundreds of thousands of logic gates, software simulators become very slow. In particular, even with state of the art software simulators, they are generally only capable of executing the equivalent of several central processing unit (CPU) cycles per second of execution corresponding to a full size mainframe machine. Thus, in simulating mainframe logic which executes many millions of CPU cycles per second, it is seen that software simulators in the same period of time are only able to simulate the execution of less than ten or so CPU cycles. This is clearly inadequate for the level of exhaustive verification needed due to the state of VLSI and the cost of chip production. In particular, the degree of verification required mandates the generation of a large number of test cases. Thus, even though it seems like a hundred thousand test cases is a large number, this may in fact only correspond to milliseconds of machine operation which is far too short a time for one to adequately rely on the simulation results.

It is thus seen that both software simulation and hardware modelling for large scale VLSI circuits have their limitations. One of the most promising solutions to this problem lies in the area of hardware assisted simulation. This method employs hardware accelerators for parts of the process. It provides a mechanism for running major cycles of simulation (for example billions of cycles) prior to committing a design to hardware and to production chip runs. Hardware assisted simulation is also fast enough to provide the ability to recreate problems discovered in real hardware. The only drawback has been the ability to easily isolate problems and gather trace information necessary to debug problems. The present invention provides a solution to this latter problem.

More particularly, hardware assisted simulations (hardware accelerators) provide a mechanism for rapidly executing machine cycles. However, when errors or other unusual conditions occur, it is not practical for these systems to provide detailed traces of various machine states at sequential closely spaced time intervals. On the other hand, such detailed trace information is readily gleaned from software simulators. However, as was pointed out above, software simulators operate insufficiently fast for analyzing more than a few machine cycles per second of real time.

Additionally, there is another problem which is addressed by the present invention, namely the effective utilization of hardware accelerator devices. These devices tend to be expensive and accordingly, it is desirable to be able to operate them continually. However, operating them in any kind of a mode which requires detailed tracing which can occur as a result of error indications or other model peculiarities, is an inefficient use of the hardware accelerator as a resource. Accordingly, the present invention also addresses the problem of utilizing hardware accelerators in an efficient and effective manner.

SUMMARY OF THE INVENTION

In accordance with a preferred embodiment of the present invention, a hardware accelerator is periodically interrupted and system checkpoint data associated with the accelerator is stored. This checkpoint data is indicative of the hardware accelerator state at that point in time. Previously generated desired resultant states are then compared against the states generated by the hardware accelerator. In the event of a miscomparison (or model detected error or user specified trap), the hardware accelerator is interrupted and reset to a previously stored checkpoint state. The accelerator is then operated for a time sufficient to bring the hardware simulator to a state which existed just prior to the interruption which occurred as a result of the comparison mismatch (or detected error or trap). At this point in time, a software simulator is invoked which is initially set to a hardware accelerator state existing prior to the error condition. As the software simulator operates, the resultant states and output conditions from the software simulator are stored and provide a more finely resolved sequence of states than that produced by periodically interrupting the hardware accelerator. By controlling the frequency of the periodic interruption of the hardware accelerator, it is possible to control load balancing between the hardware accelerator and the software simulator.

In this fashion, the best features of hardware accelerators and software simulators are combined. The hardware accelerator is permitted to run as rapidly as possible until error conditions arise. At this point, as a result of having stored previous checkpoint states and having recorded stimulus data available, the hardware accelerator may be interrupted and reloaded with a previously recorded checkpoint state. The hardware accelerator with the checkpoint state loaded is then allowed to operate using recorded stimulus data up until a time just before the error occurred, at which time the state of the simulator is passed on to a software simulator along with the recorded stimulus data. The software simulator is therefore rendered capable of providing a more finely resolved and detailed trace sequence associated with the error condition. The hardware accelerator may then be reinitialized to a different run state for a different test case or model or, it may be restarted from where it left off. At the same time, a software simulator, a less expensive resource, is employed to provide a more detailed analysis of those conditions that led up to the error or other identifiable hardware condition for the test case sequence. It is therefore particularly noted that it is often the case that software simulation of an error condition is running on a host processor at the same time as the hardware accelerator is operating upon supplied test cases. In these ways a hardware accelerator and software simulator are employed together cooperatively, taking full advantage of the strengths of each simulation modality.

Additionally, the present invention provides a mechanism for insuring an efficient utilization of the hardware accelerator through the use of a queue of test cases. By keeping this queue full, it is possible to provide an extremely high utilization of the expensive hardware accelerator resource.

Accordingly, it is an object of the present invention to be able to simulate large scale logic circuits in a reasonable amount of time and at a minimal cost.

It is a still further object of the present invention to provide a mechanism for balancing workload between software simulators and hardware accelerators resources so that neither resource operates for an excessive period of time performing tasks more suitable for the other.

It is also an object of the present invention to provide optimal utilization for expensive resources such as hardware accelerators.

It is yet another object of the present invention to couple software simulators together with hardware accelerators in such a way as to best utilize their relative strengths and minimize their relative weaknesses.

It is a still further object of the present invention to simulate complex logic devices and to exercise models of these devices utilizing as many test cases as possible.

It is also an object of the present invention to facilitate the generation of error trace information.

It is yet another object of the present invention to provide a faster turnaround time for the design of logic circuit devices and systems.

It is also an object of the present invention to be able to operate software simulators over fewer numbers of machine cycles and only for times corresponding to error or unusual conditions.

It is yet another object of the present invention to be able to operate hardware accelerators in a relatively uninterrupted fashion and in a fashion such that it is possible to restart such accelerators and continue from identified checkpoints.

It is a still further object of the present invention to permit the design and testing of even larger and more complex electronic systems and circuits.

Lastly, but not limited hereto, it is an object of the present invention to provide a method for model partitioning to further facilitate the simulation of large logic circuit systems.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIGS. 1, 1A, 1B and 1C constitute a flowchart (and its layout in FIG. 1) illustrating the overall process of the present invention;

FIGS. 2A and 2B are a set of functional block diagrams illustrating a computer apparatus for carrying out the present invention;

FIG. 3 is a schematic diagram illustrating the data flow between a hardware accelerator and a controlling machine;

FIG. 4 is a time line drawing illustrating normal operation sequences;

FIG. 5 is a time line view similar to FIG. 4 but more particularly illustrating the sequence of events occurring upon a comparison mismatch, model error or trap condition;

DETAILED DESCRIPTION OF THE INVENTION

Figure 1B:
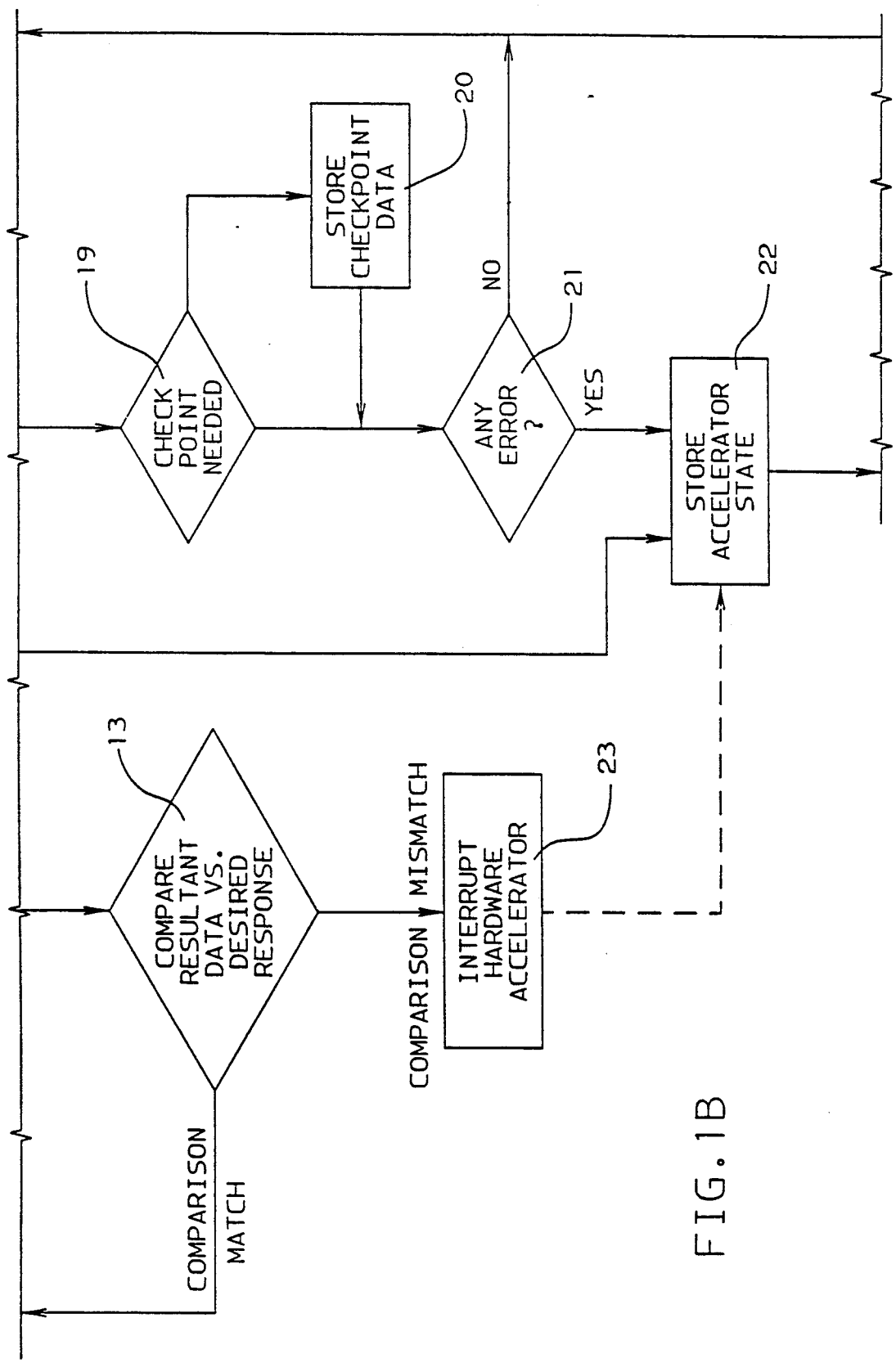
Figure 1C:
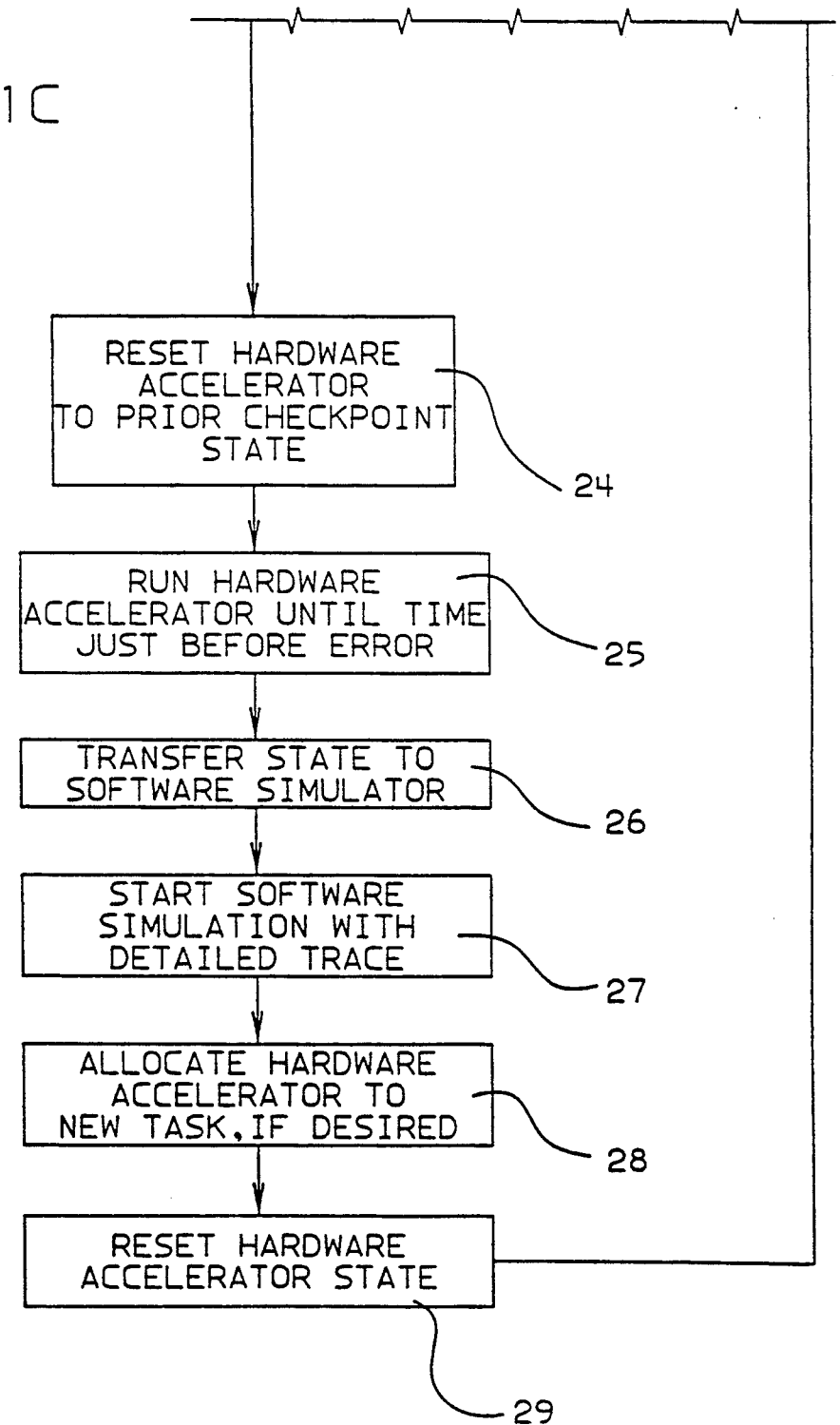

FIGS. 1, 1A, 1B and 1C (collectively referred to herein as FIG. 1) constitute a flowchart illustrating the overall flow of the process described in accordance with the present invention. The left hand portion of the flowchart illustrates the operation of the host test generation and comparison program. The right hand portion illustrates the operation of the hardware accelerator and host control program. The dashed lines denote points of interaction between a host processor and the hardware accelerator.

In particular, prior to operating a hardware accelerator, it is necessary to provide a plurality of test cases. These cases are designed to exercise the particular logic design being simulated. Desired responses to these test cases are also generated. As indicated in FIG. 1, the test cases are stored (step 10) as are the desired responses (step 11). Initially a predetermined model state is also established and saved prior to the commencement of simulation. The test cases and the desired responses to them are preferably generated ahead of time and stored (steps 10 and 11 respectively) in a host machine in a queue structure. Subsequently, the test cases are supplied (downloaded) to the hardware accelerator (step 14). However, when and if the host machine is not busy running detail traces with a software simulator, the host or other machine may operate to get further test cases and responses.

Step 15 in FIG. 1 illustrates an operation and/or state of operation in which the hardware accelerator is either started or allowed to continue. If no model errors are detected within the hardware accelerator (step 16), normal processing continues (at step 17). If model errors do occur the hardware accelerator is interrupted and the accelerator state is stored (see step 22 below). As noted in step 17, it is a feature of the present invention that the hardware accelerator is periodically interrupted so that checkpoint (steps 19 and 20) and resultant data may be stored (step 18) in the host machine and new cases supplied. Generally, checkpoint data is collected a lot less frequently than resultant test case data. Based on experience, resultant test case data is preferably collected about 10 times more frequently than checkpoint data. Transfer of the checkpoint state data preferably occurs across a channel interface (300 in FIG. 3) to a host machine (100 in FIG. 3). Following transfer of desired checkpoint state data, the hardware accelerator is supplied with more test cases (step 14) and restarted (step 15).

At the same time that the hardware accelerator is running, a host processor retrieves resultant data (step 12) and operates to compare the resultant data with the stored desired responses (step 13). It is also noted that the hardware accelerator is allowed to run forward in time while comparison operations are being performed in the host processor. If there is a comparison mismatch (step 13), then one of the mechanisms of the present invention is triggered, as seen in step 23. At this point, an interrupt signal is sent to the hardware accelerator (step 22) so that the current hardware accelerator operation can be terminated. The accelerator state may then, if desired, be saved so that it would be possible that the accelerator be restarted at the state where it left off prior to the interruption. Or it may be assigned a new state associated with a different task or model once error isolation is achieved in the hardware accelerator. Then, in accordance with the present invention (step 24) the hardware accelerator is reset to a previously stored checkpoint state such as that which is produced and stored in step 20 described above. Then, the hardware accelerator is operated for a length of time (step 25) sufficient to bring the state of the accelerator, and correspondingly the system which it is modeling, up to the state that existed just before the time associated with the model error. This saves a significant amount of time that would otherwise have to be expended by a software simulator running from a previous checkpoint state. Next, the state of the hardware accelerator is transferred (step 26) to a software simulator (see FIG. 3). The software simulator, typically running on host machine 100 in FIG. 3 is then started (step 27) and made to operate for a period of time sufficient to cover the error indication. In this way, it is possible to isolate a small window in time for a detailed trace analysis. As indicated above, it is this kind of detailed trace analysis which is most readily handled by software simulators. The start of the software simulation with detailed trace capabilities is indicated in step 27. At the same time that the software simulation is begun, the hardware accelerator is restored to the state that existed prior to its interruption or even to a state associated with a different task if desired (step 28 being optional). The hardware accelerator is then restarted. This is shown in steps 28 and 29 respectively. The operations indicated in steps 14 and 15 occur next in which typically, the hardware accelerator and software simulator are both simultaneously operating with the hardware accelerator being periodically interrupted for the storage of checkpoint states, resultant data and for the loading of test cases.

If there are no comparison mismatches occurring in the host processor flow (step 13), control is returned to step 30 in which more test cases are retrieved, if necessary, after which control returns to step 10 as described above.

Figure 2A:
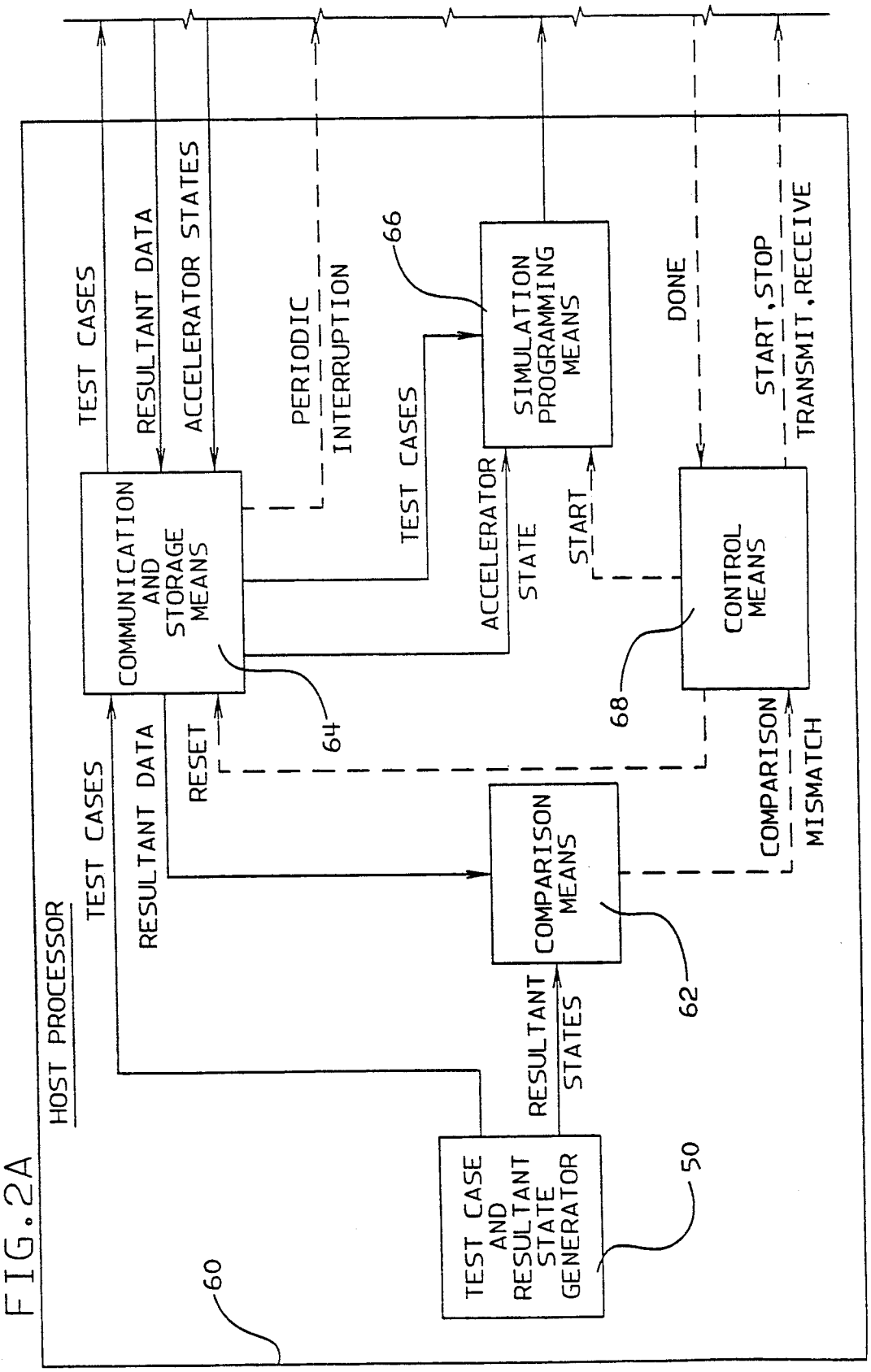

An apparatus for carrying out the method of the present invention is illustrated in FIG. 2. In particular, FIG. 2 illustrates test case and resultant state generator means 50 which supplies test cases and resultant states to host processor 60. Test case and resultant state generator 50 may operate separately in an independent processing system, but it is preferred that it operate in host processor 60. Host processor 60 communicates with and partially controls hardware accelerator 70. In particular, host processor 60 includes software simulation programming means 66 which receives accelerator state information and operates to produce detailed trace sequences for the model being simulated. The same model can be simulated by software simulation means 66 and hardware accelerator 70 when detailed error isolation and analysis is involved. However, software simulation means 66 provides a much more finely resolved picture of output signals and state functions. These more finely resolved sets of simulation data are preferably supplied to a detail file existing on direct access storage device 80.

Test case and resultant state generator 50 preferably operates in a mode in which both test cases and resultant data are maintained in a queue in the main storage unit of host processor 60. Communication and storage means 64 operates to provide a communications interface between host processor 60 and hardware accelerator 70. Accordingly, communication and storage means 64 operates to supply test cases to hardware accelerator 70 and also to transfer resultant, checkpoint and other data to and from accelerator 70. Communication and storage means 64 also operates to transfer accelerator state data between processor 60 and accelerator 70. Additionally, communication and storage means 64 also operates to provide the above described periodic interruption of accelerator 70 for the storage of checkpoint data.

Resultant data is also supplied by communication and storage means 64 to comparison means 62 which also preferably receives expected resultant state data from generator 50. This generation task is generally performed by generator 50, although it could be done separately. In the event of a comparison mismatch between resultant data and expected resultant data, comparison means 62 (which is preferably part of generator 50, though not shown as such solely for reasons of clarity of function description) provides a comparison mismatch signal to control means 68.

When a mismatch has been detected by comparison means 62 operating in host processor 60, control means 68 then operates to stop the operation of hardware accelerator 70 and to transfer to hardware accelerator 70 checkpoint data corresponding to a hardware accelerator state which existed prior to the comparison mismatch. It is usually preferable to have this checkpoint state supplied to accelerator 70 to be the latest such state possible to minimize the playback operation of accelerator 70. However, in the case that it takes a longer time to recreate the failure state, there exists the possibility of restarting accelerator 70 from several checkpoint states. After preexisting checkpoint data has been supplied to accelerator 70, control means 68 operates to restart accelerator 70 and to cause accelerator 70 to operate for a time sufficient to bring hardware accelerator 70 to a state existing prior to the state corresponding to the comparison failure by using a sequence of test cases as initially supplied and contained in a record file preferably maintained by communication and storage means 64. Once hardware accelerator 70 has operated for this desired period of time, the accelerator is halted and the then currently existing accelerator state is transferred to host processor 60 through communications and storage means 64 and ultimately to simulation programming means 66. In this way, the software simulator is started at a time corresponding to a time just before the error occurred and is allowed to run so as to produce a detailed trace analysis of the error. In this way, greatest advantage is taken of software simulation features without sacrificing the speed associated with hardware accelerators.

In the case of uniquely monitored events (user defined traps), the state of the hardware accelerator which exists when interrupted by control means 68 as a result of the event, may be stored by communication and storage means 64 and may later be transferred back to hardware accelerator 70 so that accelerator 70 may be restarted at a point where it left off. However, for error conditions this is not the usual mode of operation. As a result of a model error, it is likely that accelerator 70 may be restarted with a different model.

In preferred embodiments of the present invention, test case and resultant state generator 50 may in fact comprise separate processor means. However, in preferred embodiments of the present invention software simulation means 66, comparison means 62 (usually part of generator 50), control means 68 and communication and storage means 64 are all present within host processor 60. Furthermore, these functions are preferably implemented by means of software programs residing in one or more memory units (including direct access storage devices (DASD)) accessible by host processor 60.

The present invention is usable with a number of software simulation products. Such products include for example HILO-3 (from Genrad Inc.), VERILOG (from Gateway Design Automation Inc.) and SILOS (from Simucad Inc.). Additionally, the invention is also usable with a number of hardware accelerator devices including IKOS 800/900 (from IKOS Systems Inc.), SUPERSIM, (from Simulog, Inc.), RPM (from Quickturn, Inc.) and SDE (from ZYCAD, Inc.).

An alternative description of a system for carrying out the method of the present invention is illustrated in FIG. 3. In particular, host processor 100 preferably communicates with hardware accelerator 200 through channel interface 300 which is used to transfer test cases to model 210 being simulated and also to return model status and output information to host 100. Additionally, there is preferably provided a second communications link to hardware accelerator 200 which provides start, stop and transmit signals. These signals start the operation of accelerator 200 from a given state as specified in storage unit 214 which is driven by CPU model 212 of model 210. When it is desired to interrupt the operation of the accelerator, as for example to prepare for the transmission of resultant data, a stop signal is sent to accelerator 200. Additionally, a transmit signal may be supplied to accelerator 200 to cause information in storage 214 to be passed to host processor 100 through channel interface 300.

In the present invention, in order to drive the CPU model and the hardware accelerator, random instruction streams are loaded into model storage 214. These streams are created by a host program that operates under parametric control allowing a sequence of operations indicated within the stream to bypass or to concentrate on specific segments of the machine being modelled. After execution of the test streams within the model, the drivers then verify the results with the expected stream results.

In a typical interaction with the system shown in FIG. 3, a user initiates a job and specifies the model, the test case drivers, the number of drivers and the length of the run. Random test drivers 110 then each create a test case of different length. These test cases are stored in queue 120 under host control. At appropriate times, a supervisor program running on the model under test in the accelerator signals that it needs work. This condition occurs when all test cases presently loaded within the model have reached either a termination or suspension state. When this event occurs, control logic for the hardware accelerator interrupts the host which stops the accelerator. Host program MAPPER 130 then extracts the resultant data for the test cases that are terminated or completed, returning it to queue 140 for checking by driver 110 program. MAPPER program 130 then loads the new input queue element from queue 120 into accelerator 200 with simulation then being restarted and operating against the established queue in host 100. This sequence continues until user run criteria are attained, a model error is detected or a simulation miscompare is discovered. Throughout the operation, a record is made of all transmissions to model 210 with periodic model checkpoints being taken. FIG. 4 is a representation of this activity as seen by hardware accelerator 200.

When a model error is detected or a simulation miscompare arises, an analysis is done. This used to be done by making iterative runs to track and analyze different data until the problem was isolated. This was both a time consuming process and was wasteful of a significant resource. To rectify this problem, the present invention has provided a desired "auto-playback" feature. When test case driver 110 reports a miscompare, the host software first terminates the simulation session in process and associates the miscompare with a unique test case and then with a "needwork" point in time. It also finds the closest model checkpoint that precedes that needwork point taken and reinitializes the model under test to that state. The model is then driven by playing back the transmission data from the record file, taking less time and CPU resources. Just prior to the needwork transfer containing the failing test case, the control software flags the particular test case. A macro within the model checks for the test case flag as simulation progresses. When the flag is detected at the beginning of the particular test case, the simulation run terminates and a model checkpoint is taken. This checkpoint data is sent to a software simulator with an identical model along with a record of transmissions to the model occurring after the checkpoint. That software model is initialized to the state from the last hardware accelerator checkpoint and now produces a complete cycle-by-cycle trace of all facilities in the model, as the simulation progresses. The cycle-by-cycle trace is produced by applying any stimulus that was transmitted to the hardware accelerator. This is essentially the sequence of events of a simulation run for effective problem analysis and is shown in FIG. 5.

It is also noted that while presenting an effective set of test cases, prior art mechanisms do not suffice to keep a hardware accelerator busy due to the loading and unloading of data and the need for data gathering for problem analysis. To solve these problems, the present system operates to build queues of test data so as to increase accelerator utilization time. The present invention also maintains tracking of test cases and records all transactions to the model.

The present invention also provides checkpoints for the model state and restores the model state when needed. The system also transports model state and playback files to a software simulator.

Figure 6:
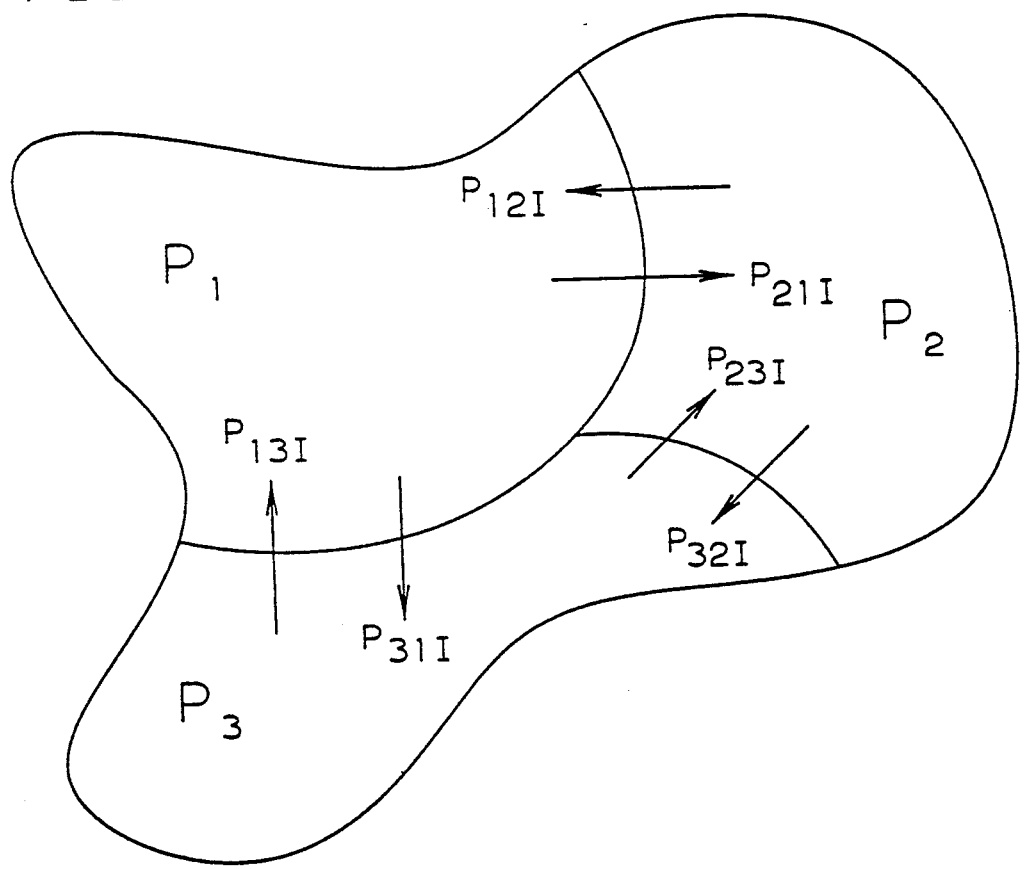
FIG. 6 is a schematic diagram illustrating model partitioning and sample variables associated therewith.

The present invention also provides a data playback feature which provides means for tracing model subsets. A further extension of the basic concept has also been added to accommodate very large models which cannot be contained within a software simulator. This is called model partitioning. Here the model is defined in terms of two or more partitions (see FIG. 6). Prior to simulation, software is run to isolate all those facilities which act as inputs to a partition. For example, all of the readily definable parts of a central processing unit (CPU) are associated with sets of input/output signal lines which thus define the relationships between various parts of a partition.

The simulation proceeds as previously with the exception that, after the checkpoint is taken at the beginning of the failing test case, the test case proceeds in the hardware accelerator, stopping at the end of each cycle to capture in a file, the inputs to the partitions that will be run on the software simulator. This continues to the end of the particular test case. The checkpoint taken at the beginning of the failing test in the hardware accelerator is used to initialize the subset model in the software simulator. Thereafter the data from the file is used to drive the inputs to the subset model on a cycle-by-cycle basis as the simulation progresses.

From the above, it can be seen that the present invention employs the best aspects of two distinct tools in a cooperative fashion to produce a complete process. The person running the simulation is provided with all of the advantages of a high speed hardware accelerator so as to automatically allow runs of hundreds of thousands to millions of cycles. Furthermore, these cycles are automatically coupled to the software simulator to provide great ease for problem analysis. Thus the software simulator which is relatively slow is only needed to run from a few thousand to a few tens of thousands of machine cycles. This greatly facilitates the turnaround time for model simulation and furthermore takes maximum advantage of a relatively expensive resource such as a hardware accelerator.

It is noted that the operation of the present invention has been described in part in terms of a comparison mismatch, a model error or user defined trap condition. In the appended claims, these conditions are generically referred to as a "comparison failure".

While the invention has been described in detail herein in accordance with certain preferred embodiments hereof, many modifications and changes therein may be effected by those skilled in the art. Accordingly, it is intended by the appended claims to cover all such modifications and changes as fall within the true spirit and scope of the invention.

The invention claimed is:

1. A method of simulating digital logic circuits, said method comprising the steps of:
    storing a plurality of test cases and at least some desired resultant states associated therewith;
    supplying said test cases in a recorded sequence to a hardware accelerator which is operable to generate simulated system states in response to said test cases;
    comparing said desired resultant states against corresponding system states generated by said hardware accelerator;
    periodically interrupting said hardware accelerator and storing a system checkpoint state associated with said hardware accelerator at said times of interruption;
    interrupting said hardware accelerator in the event of comparison failure;
    resetting said hardware accelerator, upon said comparison failure, to a previously stored checkpoint state and operating said hardware accelerator, using the same specified sequence of test cases, for a time sufficient to bring said hardware accelerator to a state existing prior to the state corresponding to said comparison failure;
    invoking a software simulator which is initially set to said prior existing state in said hardware accelerator and which is provided with recorded test cases supplied to said hardware accelerator; and
    storing resultant states generated by said software simulator to provide a more finely resolved sequence of states than that produced by said periodically interrupted hardware accelerator.

2. The method of claim 1 further including the step of restarting said accelerator at the hardware accelerator state that existed at the time of the interruption occasioned by said comparison failure.

3. The method of claim 1 further including the step of restarting said accelerator at a hardware accelerator state unrelated to prior states.

4. The method of claim 1 further including, after said periodic interruption, the step of storing the inputs to a partition of said circuit.

5. The method of claim 4 in which said invoked software simulator operates on stored partition input data.

6. The method of claim 1 in which the frequency of the periodic interruption of said hardware accelerator is selected to balance the relative computational loads of said hardware accelerator and said software simulator.

7. A method for operating a hardware accelerator and software simulator in conjunction with one another in such a way that periodically saved hardware accelerator states are used to restart said accelerator after interruption of said accelerator as a result of a mismatch between desired resultant states and actual accelerator states, said hardware accelerator being allowed to run after said restart for a time sufficient to correspond to a state existing prior to said mismatch where upon accelerator state data is transferred to said software simulator for detailed trace data generation, said hardware accelerator and said software simulator operating to simulate the same model.

8. The method of claim 7 further including the step of restarting of said hardware accelerator.

9. The method of claim 8 in which said hardware accelerator is restarted at the state that existed at the time said hardware accelerator was halted as a result of said comparison failure.

10. The method of claim 7 further including the step of restarting said accelerator at a hardware accelerator state unrelated to prior states.

11. The method of claim 7 further including, after said periodic interruption, the step of storing the inputs to a partition of said circuit.

12. The method of claim 11 in which said invoked software simulator operates on stored partition input data.

13. An apparatus for performing simulation of a digital logic circuit, said apparatus comprising:

means for storing test case data and at least some desired resultant state data associated therewith;

host processor means including programmed simulation means for performing simulations of a model of said digital logic circuit;

hardware accelerator means operable to simulate the same model of said digital logic circuit;

communication and storage means for transferring test case data to said hardware accelerator, for periodically interrupting said hardware accelerator and for receiving and storing resultant data which is indicative of its state from said hardware accelerator;

means for comparing said resultant data with said expected resultant states and for generating a comparison failure signal in the event of a comparison mismatch;

control means for receiving said failure signal and, in response thereto, for halting the operation of said hardware accelerator, for transferring checkpoint data serving to provide new starting state data to said hardware accelerator and for causing said hardware accelerator to operate for a time, using said new state data, sufficient to bring said hardware accelerator to a state existing prior to the state corresponding to said comparison failure and for transferring said prior existing state data to said host processor for processing by said programmed simulation means.

14. The apparatus of claim 13 in which said control means is further operable to cause the transfer of state data for said hardware accelerator at the time it is halted, to said communication and storage means.

15. The apparatus of claim 14 in which said control means is further operable to transfer to said hardware accelerator state data corresponding to the state of said hardware accelerator that existed when halted by said control means and for restarting said hardware accelerator.

* * * * *